(12) United States Patent
Tieben et al.

(10) Patent No.: US 8,146,623 B2
(45) Date of Patent: Apr. 3, 2012

(54) PURGE SYSTEM FOR A SUBSTRATE CONTAINER

(75) Inventors: Anthony Mathius Tieben, Jordan, MN (US); David L. Halbmeier, Shorewood, MN (US); Steven P. Kolbow, Chaska, MN (US)

(73) Assignee: Entegris, Inc., Billerica, MA (US)

( * ) Notice: Subject to any disclaimer, the term of this patent is extended or adjusted under 35 U.S.C. 154(b) by 1071 days.

(21) Appl. No.: 12/039,700

(22) Filed: Feb. 28, 2008

(65) Prior Publication Data
US 2008/0204680 A1 Aug. 28, 2008

Related U.S. Application Data

(60) Provisional application No. 60/892,196, filed on Feb. 28, 2007.

(51) Int. Cl.
*B65B 31/00* (2006.01)
(52) U.S. Cl. ........... 141/63; 141/66; 141/286; 141/349; 414/222.01; 414/940
(58) Field of Classification Search .......... 55/385.2; 206/710–712; 141/59, 66, 63, 85, 286, 348, 141/349; 414/217, 222.01, 935, 940; 454/187; 134/1.3, 902
See application file for complete search history.

(56) References Cited

U.S. PATENT DOCUMENTS

| | | | |
|---|---|---|---|
| 4,609,103 A | 9/1986 | Bimer et al. | |
| 4,666,479 A | 5/1987 | Shoji | |
| 4,668,484 A | 5/1987 | Elliott | |
| 4,721,207 A | 1/1988 | Kikuchi | |
| 4,724,874 A | 2/1988 | Parikh et al. | |
| 4,815,912 A | 3/1989 | Maney et al. | |
| 4,995,430 A | 2/1991 | Bonora et al. | |
| 5,137,063 A | 8/1992 | Foster et al. | |
| 5,217,053 A | 6/1993 | Foster et al. | |
| 5,255,783 A | 10/1993 | Goodman et al. | |
| 5,303,482 A | 4/1994 | Yamashita et al. | |
| 5,346,518 A | 9/1994 | Baseman et al. | |
| 5,363,276 A | 11/1994 | Crockett | |
| 5,628,121 A | 5/1997 | Brooks et al. | |

(Continued)

FOREIGN PATENT DOCUMENTS

EP 0 313 693 5/1989

(Continued)

OTHER PUBLICATIONS

PCT/ISA/220 for corresponding PCT/US08/55388, mailed Aug. 4, 2008.

(Continued)

*Primary Examiner* — Gregory Huson
*Assistant Examiner* — Jason Niesz
(74) *Attorney, Agent, or Firm* — Patterson Thuente Christensen Pedersen, P.A.

(57) ABSTRACT

A purging station with a substrate container receiving zone having at least one upwardly extending purging nozzle. The nozzle has a circular engaging lip. The substrate container has support means for at least one substrate and a purge port assembly that includes an externally facing sealing flange facing downward from the container. The sealing flange has a central aperture and a cantilevered flange portion that engages with the circular engaging lip of the nozzle. The weight of the substrate container on the nozzle carried by the canilevered portion of the flange causes bending of the flange for a resilient soft seal.

18 Claims, 6 Drawing Sheets

U.S. PATENT DOCUMENTS

| | | | |
|---|---|---|---|
| 5,788,082 A | 8/1998 | Nyseth | |
| 5,815,947 A | 10/1998 | Brooks et al. | |
| 5,873,468 A | 2/1999 | Ejima et al. | |
| 5,988,233 A | 11/1999 | Fosnight et al. | |
| 6,010,008 A | 1/2000 | Nyseth et al. | |
| 6,032,802 A | 3/2000 | Ejima et al. | |
| 6,042,651 A | 3/2000 | Roberson, Jr. et al. | |
| 6,056,026 A | 5/2000 | Fosnight et al. | |
| 6,105,781 A | 8/2000 | Ejima et al. | |
| 6,155,027 A | 12/2000 | Brooks | |
| 6,187,182 B1 | 2/2001 | Reynolds et al. | |
| 6,199,604 B1 | 3/2001 | Miyajima | |
| 6,302,927 B1 * | 10/2001 | Tanigawa | 29/25.01 |
| 6,319,297 B1 | 11/2001 | Fosnight | |
| 6,354,601 B1 | 3/2002 | Krampotich et al. | |
| 6,428,729 B1 | 8/2002 | Bhatt et al. | |
| 6,447,584 B1 | 9/2002 | Kishkovich et al. | |
| 6,610,128 B2 | 8/2003 | Kishkovich | |
| 6,645,898 B2 | 11/2003 | Alvarez, Jr. et al. | |
| 6,690,993 B2 | 2/2004 | Foulke et al. | |
| 6,715,495 B2 | 4/2004 | Dao et al. | |
| 6,761,753 B2 | 7/2004 | Kishkovich et al. | |
| 6,763,608 B2 | 7/2004 | Dao et al. | |
| 6,796,763 B2 * | 9/2004 | Miyajima et al. | 414/805 |
| 7,014,693 B2 | 3/2006 | Kishkovich et al. | |
| 2003/0047562 A1 | 3/2003 | Wu et al. | |
| 2003/0082030 A1 | 5/2003 | Del Puerto et al. | |
| 2004/0005209 A1 | 1/2004 | Su et al. | |
| 2004/0013498 A1 * | 1/2004 | Soucy et al. | 414/217 |
| 2005/0040345 A1 | 2/2005 | Bakker et al. | |
| 2005/0077204 A1 | 4/2005 | Sumi et al. | |
| 2006/0266011 A1 | 11/2006 | Halbmaier et al. | |
| 2008/0260498 A1 * | 10/2008 | Nagata et al. | 414/217 |
| 2010/0163452 A1 * | 7/2010 | Lin et al. | 206/711 |

FOREIGN PATENT DOCUMENTS

| | | |
|---|---|---|
| WO | WO 92/07759 | 5/1992 |
| WO | WO 2005102872 | 11/2005 |

OTHER PUBLICATIONS

PCT International Search Report, Sep. 14, 2007, Entegris, Inc.

Yield Management Solutions, *Reticle Inspection*, Spring 2004, pp. 34-37.

\* cited by examiner

PURGE SYSTEM FOR A SUBSTRATE CONTAINER

RELATED APPLICATIONS

This application claims the benefit of U.S. Provisional Patent Application No. 60/892,196, filed Feb. 28, 2007; this application is also related to U.S. patent application Ser. No. 11/396,949; filed Apr. 3, 2006, U.S. Provisional Application No. 60/668,189 filed Apr. 4, 2005, and U.S. Pat. No. 7,328,727 issued Feb. 12, 2008, all of which are incorporated herein in their entirety by reference.

FIELD OF THE INVENTION

The invention relates to substrate carriers used in semiconductor manufacturing and more particularly to transportable and shippable reticle/photomask carriers and purging systems for controlling the environment in such carriers.

BACKGROUND OF THE INVENTION

The processing of silicon wafers for semiconductor applications typically includes photolithography as one of the process steps. In photolithography, a wafer surface with a deposit of silicon nitride is coated over with a light-sensitive liquid polymer or photoresist and then selectively exposed to a source of radiation using a template with a desired pattern. Typically, ultraviolet light is shone through or reflected off a surface of a mask or reticle to project the desired pattern onto the photoresist covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. The wafer is subjected to an etch process that removes the exposed portion of the nitride layer leaving a nitride pattern on the wafer in the exact design of the mask.

The industry trend is towards the production of chips that are smaller and/or with a higher logic density necessitating even smaller line widths on larger wafers. Clearly, the degree of fineness to which the surface of the reticle can be patterned and the degree to which this pattern can be faithfully replicated onto the wafer surface are factors that impact the quality of the ultimate semiconductor product. The resolution with which the pattern can be reproduced on the wafer surface depends on the wavelength of ultraviolet light used to project the pattern onto the surface of the photoresist-coated wafer. State-of-the-art photolithography tools use deep ultraviolet light with wavelengths of 193 nm, which allow minimum feature sizes on the order of 100 nm. Tools currently being developed use 157 nm Extreme Ultraviolet (EUV) light to permit resolution of features at sizes below 70 nm.

The reticle is a very flat glass plate that contains the patterns to be reproduced on the wafer. Typical reticle substrate material is quartz. Because of the tiny size of the critical elements of modern integrated circuits, it is essential that the operative surface of the reticle (i.e. the patterned surface) be kept free of contaminants that could either damage the surface or distort the image projected onto the photoresist layer during processing leading to a final product of unacceptable quality. Typically, the critical particle sizes are 0.1 µm and 0.03 µm for the non-patterned and patterned surfaces respectively when EUV is part of the photolithography process. Generally, the patterned surface of the reticle is coated with a thin, optically transparent film, preferably of nitrocellulose, attached to and supported by a frame, and attached to the reticle. Its purpose is to seal out contaminants and reduce printed defects potentially caused by such contamination in the image plane.

However, extreme EUV utilizes reflection from the patterned surface as opposed to transmission through the reticle characteristic of deep ultraviolet light photolithography. At his time, the art does not provide pellicle materials that are transparent to EUV. Consequently, the reflective photomask (reticle) employed in EUV photolithography is susceptible to contamination and damage to a far greater degree than reticles used in conventional photolithography. This situation imposes heightened functional requirements on any reticle SMIF pod designed to store, transport and ship a reticle destined for EUV photolithography use.

It is well known in the art that unnecessary and unintended contact of the reticle with other surfaces during manufacturing, processing, shipping, handling, transport or storage will likely cause damage to the delicate features on the patterned surface of the reticle due to sliding friction and abrasion. Likewise, it is generally accepted by those skilled in the art that any particulate contamination of the surface of the reticle can potentially compromise the reticle to a degree sufficient to seriously affect the end products of processes that use such a flawed reticle. In this regard, the art has developed innovative approaches to locate and support the reticle in reticle containers so as to reduce or eliminate sliding friction and consequent abrasion of the reticle and the resultant generation of contaminating particulates. In recognition of the need to maintain a controlled environment around the wafer during storage, processing and transport, the prior art has evolved approaches to isolation technology that allows for control of the environment in the immediate vicinity of a wafer by providing for a container so that it can be kept relatively free from incursion of particulate matter.

Typically, containers are provided with standardized mechanical interfaces that allow automatic manipulation of the container by processing machinery. Such containers can hold photomasks of up to 200 mm and are designated standard mechanical interface pods, or SMIF-Pods. Even with such a controlled environment, migration of particulates that may be present inside the controlled environment is still possible due to pressure changes of the air trapped in the controlled environment or turbulence of the trapped air brought on by rapid movements of the container and/or by disturbing the trapped air volume. For example, thin walled SMIF pods may experience wall movement due to altitude related pressure changes causing the trapped air inside the controlled environment to be displaced. Temperature changes can set up convection currents within the container. Dimensional changes of the container and its components due to pressure fluctuations can lead to compromising the sealing between cover and door of the carrier and incursion of particulates within the carrier. Prior art approaches contemplate a breathing apparatus between the external environment and the internal controlled volume of air. The breathing apparatus provides a path for the air to flow. Prior art breathing apparatus may include a particulate filter to block the entry of particulates from the external environment into the controlled environment of the carrier.

Those skilled in the art will appreciate that particulate contaminants are but one half of the equation. Equally important are gas-phase contaminants or airborne molecular contaminants (AMC) due to ambient air venting or leaking into or getting trapped in a hermetically sealed system. For example, at a suitable dew point temperature, the moisture in the air will condense out of the air and some of it may get deposited onto the reticle. Even with a perfectly sealed container, there is the possibility of air entering into the system when the reticle is removed from and replaced within the container during processing. Water vapor condensing onto the patterned surface of the reticle can interfere with the optics just as a solid particulate would. Other sources of gas-phase or vapor contamination that are believed to be significant are solvent residues resulting from reticle/pod cleaning operations during the photomask lifecycle, chemical agents generated by out-gassing from the structural components of the carrier and chemical agents that enter into the carrier from the ambient atmosphere by breaching the hermetic sealing arrangement between the carrier shell and the carrier door.

Multiple contamination species are thought to be the largest contributors to gas-phase contamination. These include $NH_3$ (ammonia), $SO_2$ (sulphur dioxide), $H_2O$ (moisture) and condensable organics C6-C10. Depending on the photolithography system, a photomask can be exposed to a laser light source of a wavelength that can range from 436 nm to 157 nm. Currently, 193 nm lasers are quite common. The energy of the laser can initiate chemical reactions that precipitate defect formation and propagation on the surface of the reticle. For instance, some of the chemical species are altered to form highly reactive species such as $SO_4^{2-}$ and $NH_4^+$. Some of these chemicals, such as acids for instance, are reactive with glass and can damage the reticle by etching it to create a haze on the patterned surface. The bases can create resist poisoning. The condensable organics can lead to SiC formation. In general, all of the contaminants can be considered to result in the same effect: crystal growth that degrades the functionality of the reticle. In this respect, the current thinking is that moisture or water is one of the key ingredients required for crystal growth. Essentially, water combines with some of the aforementioned contaminants to form the salts are generally clubbed together under the rubric of crystal growth. Prior art use of dessicants, for example, cannot ameliorate this problem because they cannot reduce the concentration of moisture to low enough levels to prevent salt (or crystal) formation. Likewise, purging a reticle carrier with clean dry air (CDA) or other dry gas may not reduce the moisture concentration to the levels required to avoid crystal growth. There is therefore a need for a contamination control mechanism at each stage of the reticle life cycle.

One of the approaches commonly employed in the art to ameliorate the effect of the chemical contaminants is periodic reticle/mask cleaning. The mean time between such cleans (MTBC) can approach, for example, approximately 8000 wafers in a 193 nm exposure tool. The threshold of the MTBC is set to prevent mean time between defects (MTBD) printed on the wafer using the reticle/mask. However, there is a limit to the number of such 'cleans' a reticle/mask can be subject to before resolution is degraded beyond functionality and the mask must be scrapped. In view of the above, one of skill in the art will recognize the need to ensure that the reticle environment within the carrier remains clean during storage, transportation, manipulation as well as during the standby condition when the carrier is empty of the reticle. While desirable, it is generally infeasible to construct a hermetically sealed environment that is absolutely impervious to incursion by AMCs or other contaminants. It is also infeasible to continuously purge the reticle carrier especially when the reticle and reticle carrier have to be transported or shipped.

Although purging solutions, such as disclosed in the related applications referenced above, have greatly controlled the incursion, concentration and rate of accumulation of AMCs within the photomask carrier, further improvement is desirable. Accordingly, what is needed is system, structure, or device for further ameliorating the incursion, concentration and rate of accumulation of AMCs within the photomask carrier to levels that preclude or significantly reduce the formation of crystalline salts and generally minimize the presence of any contaminants on the reticles.

SUMMARY OF THE INVENTION

The present invention, in certain embodiments, provides a reticle/mask carrier with a controlled environment within which to house a reticle during storage, transport, processing and shipping. According to a primary embodiment of the present invention, the reticle/mask carrier is equipped with means to control the ingress and build-up of particulate and gas-phase contaminants into the controlled environment.

The present invention provides systems, components, and processes for providing and maintaining a controlled environment within pods, within pods with bottom opening doors, particularly reticle SMIF pods.

In an embodiment, a pod has a flexible nozzle-receiving flange positioned on a lower surface of the door of a bottom-opening pod. The nozzle-receiving seal includes a downwardly facing, generally circular, sealing flange that may deflect axially or bend upon loading by a nozzle to form a seal.

Embodiments of the present invention provide a receiver for removably receiving a bottom-opening pod. In preferred embodiments the receiver is configured as a tray with nozzle interfaces for purging connections with the bottom-opening pod. In certain embodiments, the pod receiver has an aperture sized and positioned for allowing downward venting through a central exit filter on the bottom of a pod.

In certain embodiments, the bottom-opening pod has a pair of downwardly facing sealing flanges that directly interface with the nozzles on the tray. The sealing flanges support a portion of the weight of the pod and contents. The weight of the pod and contents loads and deflects the sealing flanges, thereby improving sealing contact between the sealing flanges and the nozzles. In an embodiment, the sealing flanges are combined with or integral with an elastomeric and/or resilient bushing or grommet that is received in an aperture extending through the door thus comprising a purge port assembly. The bushing has a bore therein that may receive a check valve component.

In certain embodiments, a diffuser portion, as part of a grommet, extends above the top surface of the door of the bottom-opening pod. The diffuser has outlets preferably oriented outwardly, so as to direct purge gas away from the patterned surface and pellicle.

In certain embodiments, the sealing integrity of the purging interfaces between the tray and the pod door can be affected by the positioning and/or stability of the pod on the tray. In an embodiment, the interface between the pod door and tray will be at discrete contact regions on the tray, providing substantially three-point or three regions of contact between the pod and the tray. There may be visually discernable vertical movement upon manual contact with the pod, in that there is preferably a tolerance of at least about 0.1 inch vertically in the resilient engagement of the purge nozzle with the sealing flanges.

In certain embodiments a purging station provides a plurality of trays arranged in a stacked configuration for receiving the bottom-opening pods. The trays can be movable, for example swivelable in a horizontal direction to provide easy access to the bottom opening pods thereon.

According to another aspect, the opening in the tray corresponds and is substantially concentric with the filter on the door of the bottom-opening pod. Moreover the filter is preferably shaped and sized substantially proportionate to the reticle and preferably positioned substantially concentrically with respect to the reticle.

According to yet another embodiment of the present invention, the bottom opening pod is provided with a means to continually inject pressurized, extremely clean dry air, denominated XCDA, into the hermetically sealed space of the reticle carrier and a means to exhaust the XCDA from the sealed space. A continuous purging in the hermetically sealed space in this manner serves to flush out contaminants and prevent haze formation or crazing on the mask/reticle therein. In preferred embodiments, a stack of swivelable trays will have purge lines to provide continuous purging of stored bottom-opening reticle pods.

Also it is noted that there appear to be similar hazing and contamination issued associated with wafer containers as described above. Thus, aspects of solutions, as described below, are also applicable to wafer containers Additional objects, advantages, and novel features of the invention will be set forth in part in the description which follows, and in part will become apparent to those skilled in the art upon examination of the following or may be learned by practice of the invention.

DETAILED DESCRIPTION OF THE PREFERRED EMBODIMENTS

Figure 1:
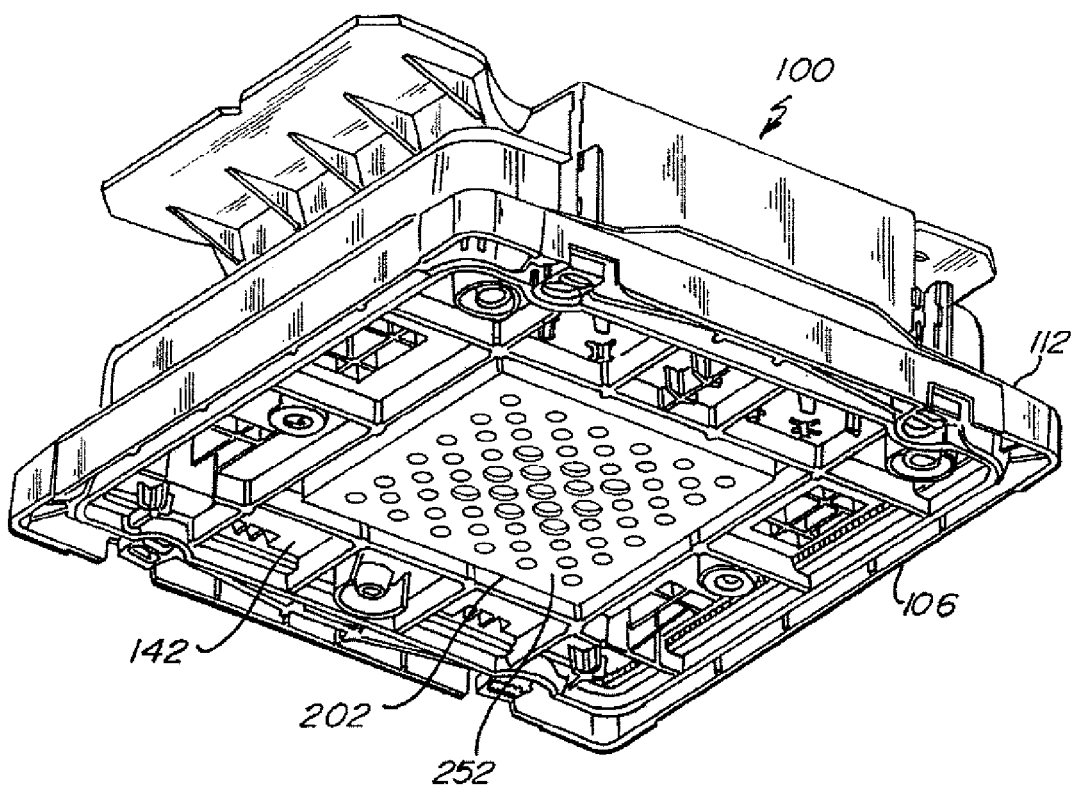
FIG. 1 is a bottom perspective view of an assembly of a bottom-opening substrate carrier according to a primary embodiment of the present invention.

The accompanying figures depict embodiments of a bottom opening pod for holding substrates, specifically configured as a reticle carrier, and a purging station configured as a swivelable stack of trays providing a library of reticle pods. Any references to front and back, right and left, top and bottom, upper and lower, and horizontal and vertical are intended for convenience of description, not to limit the present invention or its components to any one positional or spatial orientation. "Substrate" when used herein refers to wafers, or reticles used in the manufacturing of semiconductors. Any dimensions specified in the attached Figures and this specification may vary with a potential design and the intended use of an embodiment of the invention without departing from the scope of the invention.

In FIGS. 1-4a, there is depicted a bottom-opening pod for substrates configured as a reticle carrier 100 equipped with purge capabilities according to a primary embodiment of the present invention. The reticle carrier 100 (alternatively referred to as a reticle container, a reticle pod, or a reticle box) generally comprises a door portion 106 (alternatively referred to as a base portion) which mates with a carrier shell 112 (alternatively referred to as a cover) to form an hermetically sealed interior space 118 which provides a sealed environment in which a reticle 124 may be stored and transferred. The term "reticle" in used in a broad sense to include quartz blanks, photo-masks, masks used in the semiconductor industry that are susceptible to damage from particulates and gas-phase chemical contaminants. Generally, the reticle 124 is square shaped with a first surface 126 opposite a second patterned surface 128 having a surface area 129 provided with the etched pattern as discussed above. A reticle lateral surface 130 separates the first surface 126 from the second patterned surface 128 and extends around a reticle perimeter 130. It will be appreciated that the present invention is not limited by a particular shape of reticle 124.

Figure 3:
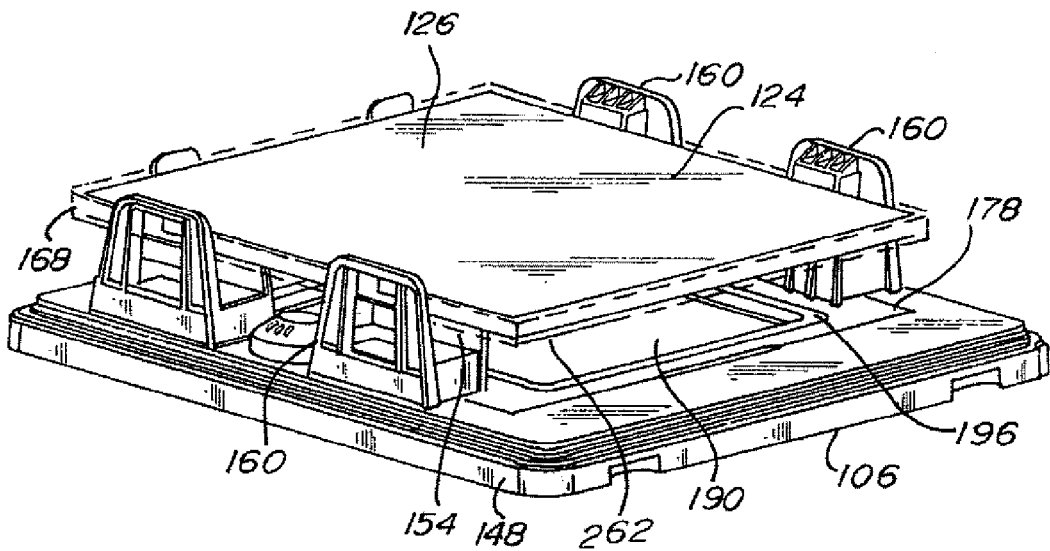
FIG. 3 is a perspective view of a base portion or door of the reticle carrier of FIG. 1 shown supporting a reticle.

The door portion 106, depicted in FIGS. 1-4a includes an opposed upper door surface 136 and a lower door surface 142 separated by a lateral wall 148. A plurality of reticle supports 154, reticle side positioning members 160 and back positioning members 166 extend outwardly from and are disposed in spaced apart relationship adjacent an upper periphery 172 of and generally about a central portion 178 of the upper door surface 136. The reticle supports 154 are configured to hold the reticle 124 at a predefined height 156 above upper door surface 136. The reticle side positioning members 160 and the back positioning members 166 serve to guide manual positioning of the reticle 124 and ensure proper lateral and rearward placement of the reticle on the reticle supports 154 so that the reticle substantially occupies and its volume bounded by a reticle receiving region 168 associated with the door portion 106 and defined by the reticle supports 154, the reticle side positioning members 160 and the back positioning members 166 as best depicted in FIG. 3. A Gasket 184 loops along the upper periphery 172 on the door surface 136. Preferably, the door portion 106 and the carrier shell 112 conform to the shape of substrate including the reticle 124.

Figure 2:
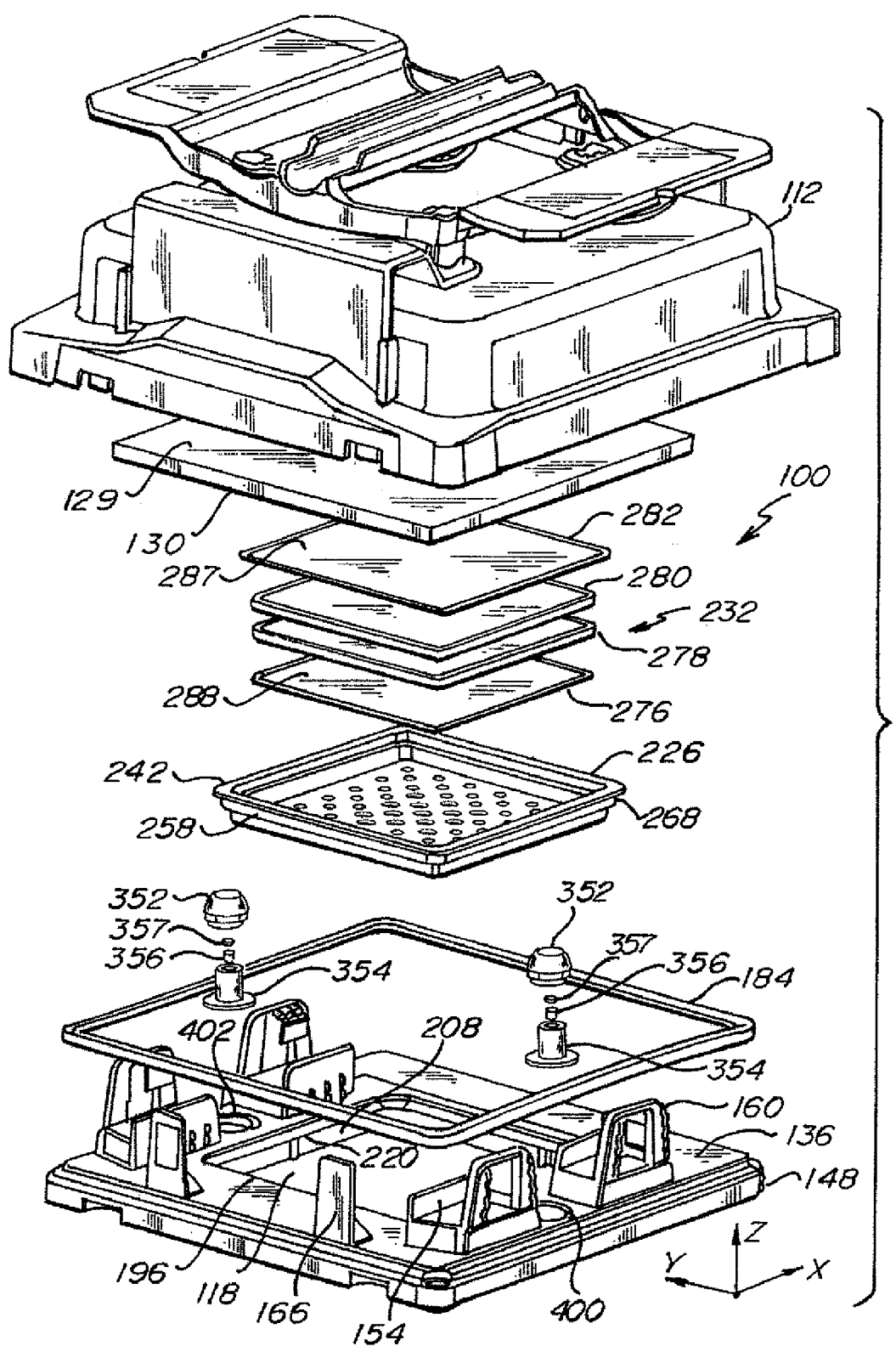
FIG. 2 is an exploded perspective view of the assembly of the substrate carrier of FIG. 1.

Referring now to FIGS. 2 and 3, door portion 106 includes central hole 190 extending through the door portion 106 and defined by a first opening 196 on the upper door surface 136, a second opening 202 on the lower door surface 142 and an inside peripheral wall 208 communicating the first opening 196 with the second opening 202. In an exemplary embodiment, illustrated in FIGS. 2-3, the first and second openings 196 and 202 are substantially square shaped and are characterized by their respective first and second areas 212 and 214. The inside peripheral wall 208 extends generally parallel to the lateral wall 148 of the door portion 106 between the first and the second openings 196 and 202. The inside peripheral wall 208 is configured with a peripheral shelf 220 suitable for securely supporting a filter frame 226 such that the filter frame 226 is substantially perpendicular to the first opening 196 and is located generally flush with the upper door surface 136.

In an embodiment depicted in FIG. 2, filter frame 226 can be a semi-rigid, molded plastic receptacle in which a filter 232 in accordance with the present invention may be used. The filter frame 226 is substantially hat shaped with a peripheral flange 242 (alternatively identified as a lip) circumjacent an open end 248, a filter frame side wall 258 depending from the open end 248 and terminating at a closed end 252 to define a cavity 262 adapted to receive the filter 232. Closed end 252 has a structure defining a plurality of perforations 264. Filter frame side wall 258 includes a shoulder 268 with a shape complementary to the peripheral shelf 220 on inside peripheral wall 208. The filter frame is configured to be inserted through first opening 196 on upper door surface 136 and snug-fittingly received into central hole 190 for detachable mounting in door portion 106 with flange 242 resting on upper door surface 136 and shoulder 268 securely positioned on peripheral shelf 220 of inside peripheral wall 208. In alternate embodiments, an elastomeric seal or gasket such as for example, the gasket 184 described above, can be interposed between the shoulder 268 and the peripheral shelf 220 to provide a hermetic seal between the filter frame 226 and the filter 232.

In an embodiment of the present invention, the first area 212 of the first opening 196 is configured to be substantially proportional to the surface area 129 of the second patterned surface 128 of the reticle 124. According to one aspect of the particular embodiment, the first area 212 is at least 50% of the surface area and in a further embodiment the surface area is at least sixty percent (60%) of the surface area 129 and preferably in the range of seventy-five percent (75%) to one hundred percent (100%) of the surface area 129. In the preferred embodiment of the present invention, the first area 212 is substantially concentric with reticle receiving region 168. Furthermore, the first opening 196 and the location of reticle supports 154 are arranged so that in a assembled configuration, i.e. when the carrier shell 112 is mated to the door portion 106 and the reticle 124 is supported on the reticle supports 154, the filter 232 is located with the surface area 288 disposed opposite at least a portion of second patterned surface 128 within the hermetically sealed space 118 such that reticle perimeter 130 overlies perimeter 289 of surface area 288.

One of skill in the art will recognize that other operative configurations of surface area 288 and second patterned surface 128 are possible without departing from the scope of the present invention. All of the aforementioned operative configurations are selected to maximize the extent of the surface area 288 relative to the second patterned surface 128 based in part upon the dimensions of the hermetically sealed space 118, the diffusion length generated during reticle carrier purging, reticle processing, transport, shipping and storage and other conditions the reticle 124 might encounter during its residency within the reticle carrier 100. The surface area 288 is disposed proximate the second patterned surface 128. By selecting the extent and location of surface area 288 in the manner of the present invention, the probability, that a particulate present within or entering the hermetically sealed space 118 will preferentially encounter and settle upon the surface 288 instead of diffusing onto the secondary patterned surface 128, is maximized. To those skilled in the art, the extent of surface area 288 is representative of the total number of fluid passages available for entry of a fluid into the filter 232. The term "high-surface area" associated with reference numeral 338, on the other hand, refers to the effective surface area of the total filter media available for filtration as the fluid flows through the entire thickness 290 of the filter 232. The effective surface area controls adsorption of gases and chemical reactions. In this regard, the filter 232 differs from the prior art SMIF pod filters in that the filter 232 of the present invention is structurally a significant component of the door portion 106 because surface 288 can extend over a substantial portion of the upper door surface 136. Furthermore, in the assembled configuration, base layer 276 is positioned on closed end 252 so that filter 232 places the hermetically sealed space 118 in fluid communication with the ambient atmosphere outside the reticle pod 100 through the plurality of perforations 264.

According to an embodiment of the present invention, the concentration of moisture within the hermetically sealed space 118 is preferably maintained at concentration levels approaching a few parts per billion (ppb). Using prior art approaches, such as dessicants for example, moisture concentrations within the hermetically sealed space 118 can be controlled only to within a few parts per million (ppm). The level of humidity control achieved by coupling reticle pod 100 to a purging system which periodically flows a very dry gas, such as for example dry nitrogen gas or dry argon, through the hermetically sealed space 118.

One of skill in the art will recognize that injecting a very dry purge gas, for example dry nitrogen gas and dry argon gas, under pressure into the hermetically sealed space 118 will cause at least a portion of the purge gas to egress through the filter 232 and out into the ambient atmosphere through the closed end 252. An apparatus and method of purging the reticle carrier 100 is described in U.S. Pat. No. 5,988,233 and U.S. Pat. No. 5,810,062, the entire contents of the two patents being incorporated herein by reference in their entirety. In an alternate embodiment, the hermetically sealed space 118 is pressurized by the purge gas flowing into it through purge diffuser fittings. The purge gas exits the hermetically sealed space 118 through the filter 232. Generally, purging the hermetically sealed space 118 removes trace contaminants by entraining them in the gas flow. Purging with dry gas also dehumidifies the filter 232. Purging under pressure may dislodge and thus remove particulates and other contaminants that may be weakly bonded to the physiorptive media filter elements and the filter elements that specifically filter particulates. In effect, purging regenerates filter 232 by replenishing its capacity to adsorb contaminants. One of skill in the art will appreciate that the capacity of the filter 232 of the present invention may also be replenished by replacing the depleted filter 232.

According to an embodiment depicted in FIGS. 2, 4, 4a, 5, and 6, the nozzle interface or purge port assembly 350 generally includes diffuser body portion 352, nozzle receiving portion 354, and optionally, check valve assembly 356 and filter 357. Body portion 352 generally includes barrel portion 358, defining lateral channel-shaped groove 360, and upper spherical portion 362. Diffuser body 352 defines hollow interior space 364. A plurality of diffuser ports 366 are defined on one side of upper spherical portion 362, and extend through from hollow interior space 364, configured as a bore, to exterior surface 368. Nozzle receiving portion 354 generally includes shank or tubular portion 370 with integral resiliently flexible sealing flange portion 372 at lower end 374. Shank portion 370, configured as a tubular portion, defining hollow interior space 376. Inlet opening or aperture 378 extends through flange portion 372 to interior space 376. Flange portion 372 includes a supported flange portion 381 adjacent and integral with the tubular portion 370 and a cantilevered flange portion 383 integral, concentric, and radially outward from the supported flange portion 381. The supported portion 372 has a diameter of $d_1$, suitably ¼ inch to ¾ of an inch and the cantilevered flange portion has a diameter $d_2$ of, suitably ⅜ inch to 1 inch.

The diffuser body portion and nozzle receiving portion are formed of a resilient polymer such as Hytrel® (a polymer of E.I. DuPont de Nemours and Company). Other thermoplastics, such as PBT (polybutylene terephthalate) may be suitable, including elastomers.

As depicted in FIG. 2, door portion 106 defines apertures 400, 402, extending through from upper door surface 136 to lower door surface 142. Each aperture 400, 402, has inwardly facing circumferential edge 404 Bottom edge 380 of barrel portion 358 may be rounded or beveled to enable insertion of diffuser body 352 into apertures 400, 402, from upper door surface 136.

Figure 4:
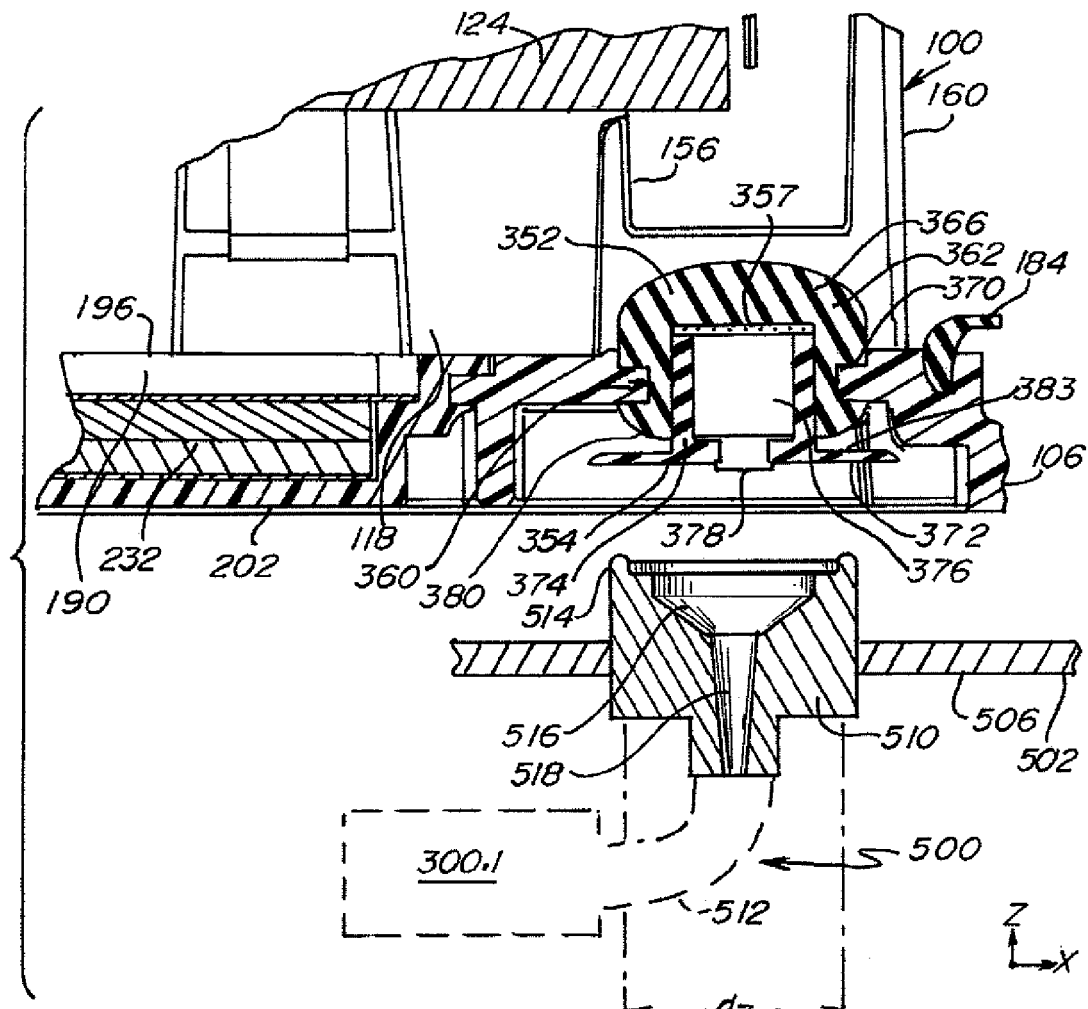
FIG. 4 is a side cross-sectional view through the base portion including a diffuser nozzle assembly in the interior of the pod and further depicted with the pod positioned over a purge tray.
Figure 4A:
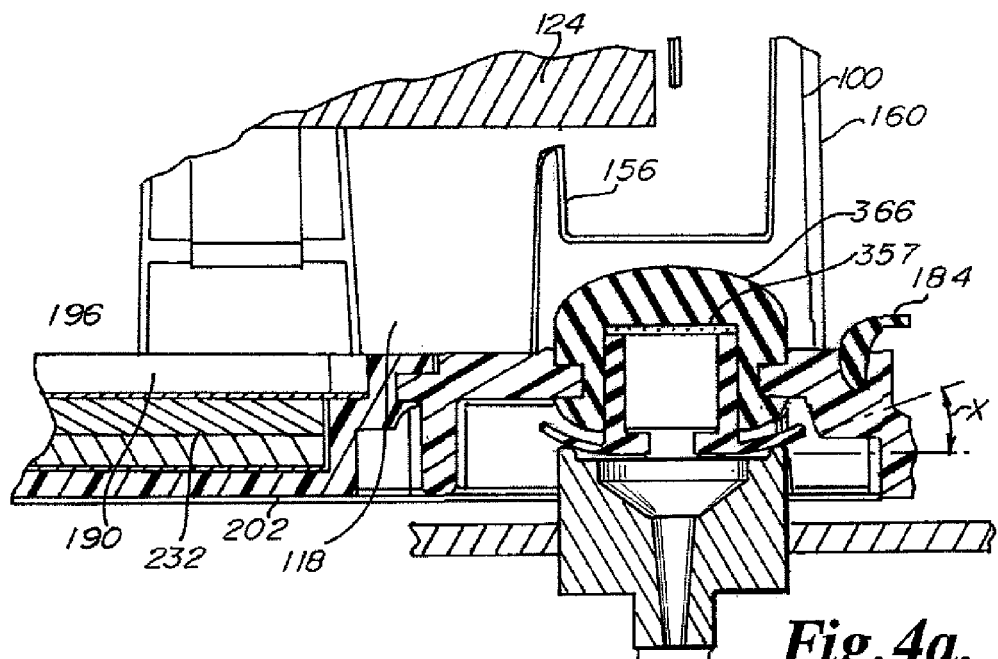
FIG. 4a is a side cross-sectional view through the base portion as depicted in FIG. 4, but with the sealing flanges of the diffuser nozzle assembly engaged with the purge nozzle of the purge tray.

A separate purge port assembly 350 is received through each of apertures 400, 402. Inwardly facing circumferential edge 403 is received in lateral groove 360 to sealingly secure the purge diffuser assembly in place in the aperture. Importantly, diffuser ports 366 are oriented outwardly toward lateral wall 148 so that purge gas is introduced intermediate the sides of the reticle and directed away from the patterned surface or pellicle. As depicted in FIGS. 4 and 4a, shank or tubular portion 370 of sealing insert 354 is sealingly received in hollow interior space 364 of diffuser body 352 with flange portion 372 facing downwardly.

Figure 9:
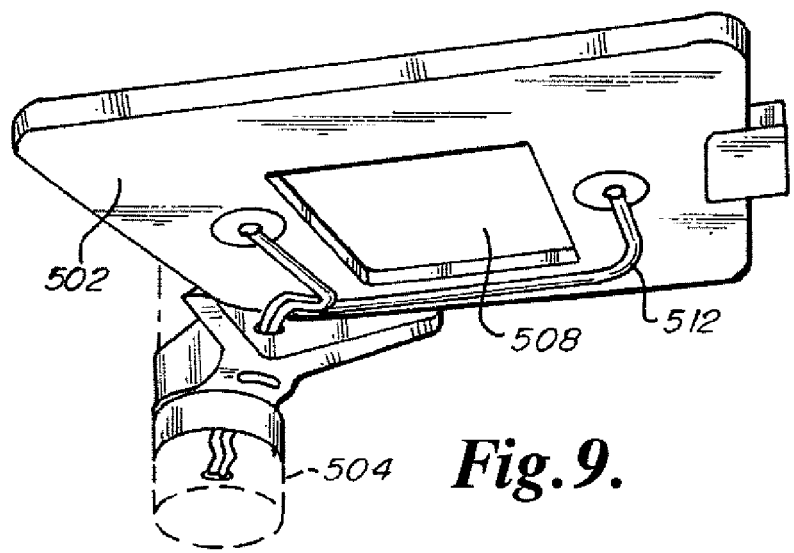
FIG. 9 is a bottom perspective view of a tray of the pod library of FIG. 7.
Figure 8:
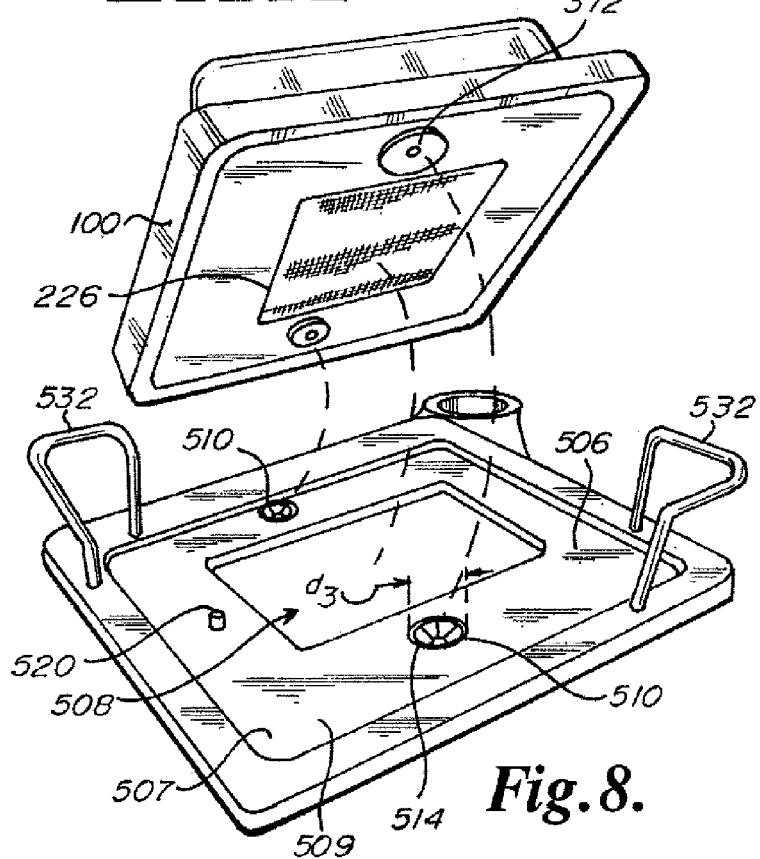
FIG. 8 is a perspective view of the top side of a tray of the pod library of FIG. 7.
Figures 5, 6:
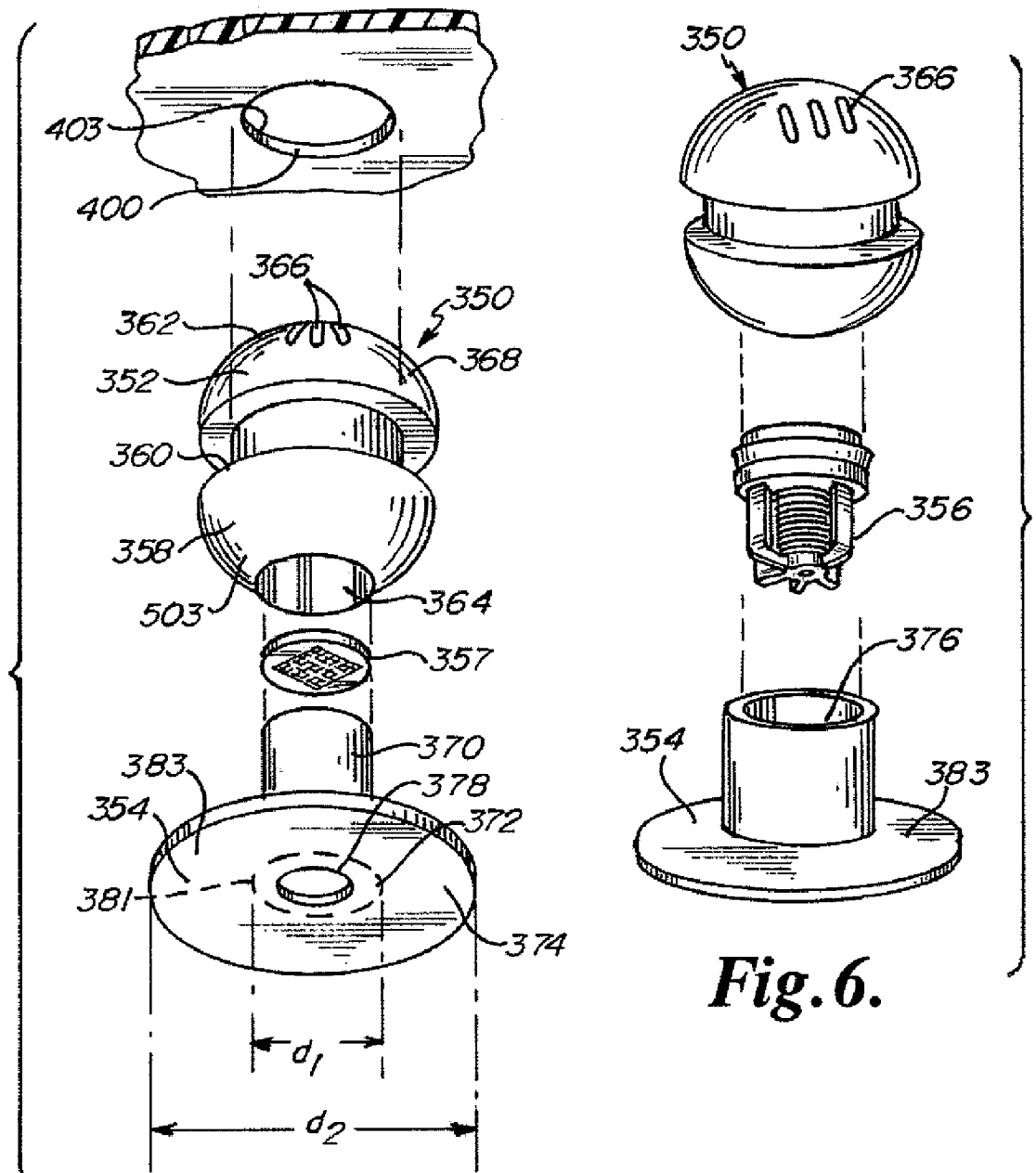
FIG. 5 is a detailed perspective view depicting the components of a diffuser nozzle assembly according to an embodiment of the invention.
FIG. 6 is a detailed perspective view depicting the components of a diffuser nozzle assembly according to an embodiment of the invention along with a check valve assembly.
Figure 7:
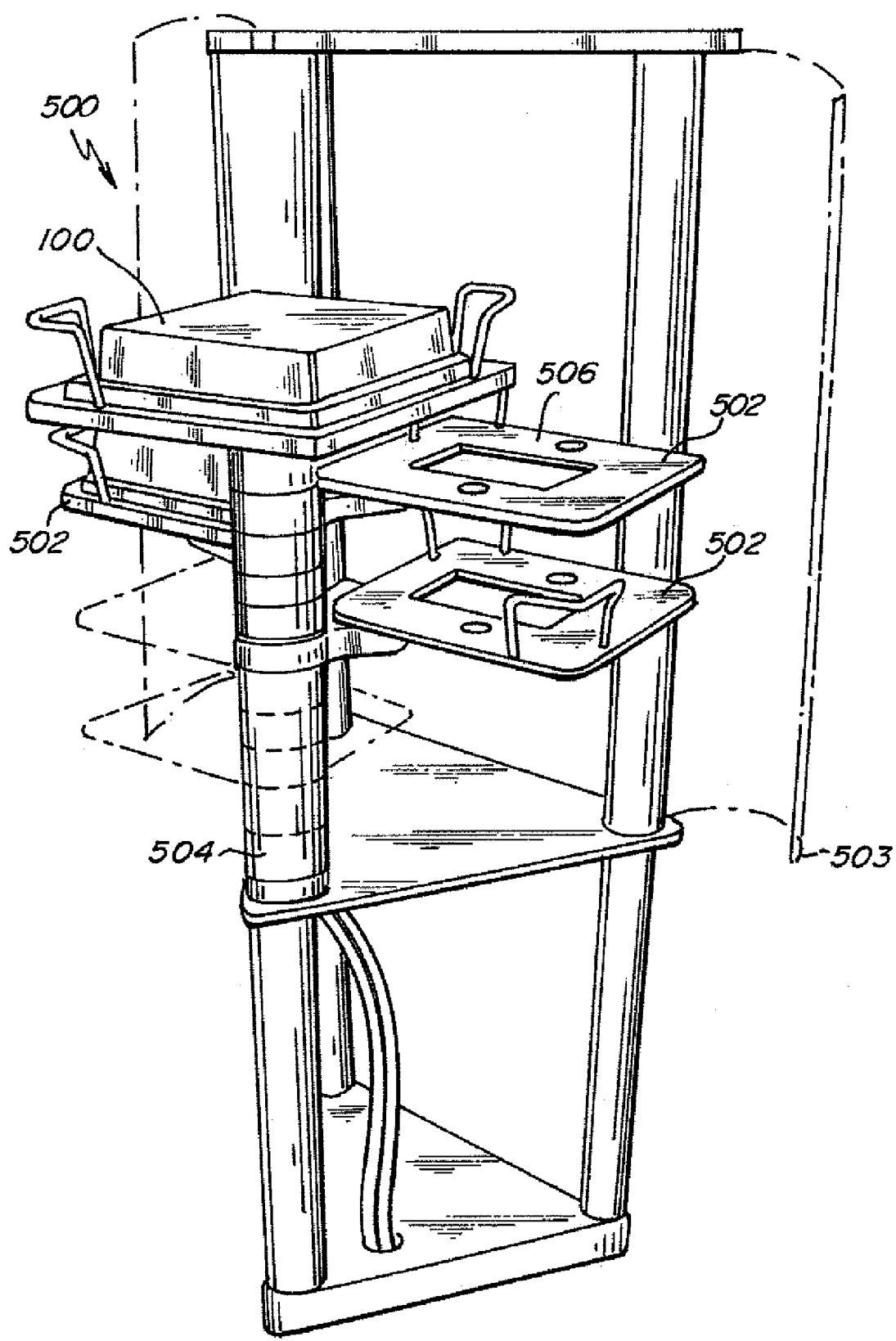
FIG. 7 is a perspective view of a pod library comprising a stack of swivelable trays for receiving bottom opening pods with purging capabilities in accord with the invention herein.

In FIGS. 7-9 there is depicted an embodiment of a purging station 500 including a plurality of purging trays 502 arranged in a stacked configuration and swivelable in a horizontal direction about central column 504 to provide easy access to the bottom opening pods 100 thereon. An enclosure 503 may be provided to provide containment of the station. Each tray 502 generally includes a planar deck portion 506 defining a recess portion 507 defining a substrate container or reticle pod, receiving region 509 and a central aperture 508, corresponding with filter frame 226 of pod 100. A pair of purge nozzles 510 extend upwardly from tray 502 and are coupled with a source 300.1 of very dry purge gas through tubing 512 as depicted in FIGS. 4 and 4a. Each purge nozzle 510 has upper peripheral lip 514 and defines a generally bowl shaped recess 516 with inlet port 518. Lip 514 has a diameter $d_3$ suitably greater than the diameter $d_1$ of the supported flange portion and less than the diameter $d_2$ of the cantilevered flange portion. Tray 502 may further include third pod contact point 520.

In use, pod 100 is placed over tray 502 with each of flange portion 372 registered with one of purge nozzles 510 as depicted in FIG. 4. As pod 100 is rested on tray 502, flange portion 372 engage purge nozzles 510 and bend or deflect upwardly as they are loaded by the weight of pod 100 as depicted in FIG. 4a to an angle α. The lower surface 503 of the body portion may provide a curved hard stop to the cantilever flange portion. Third pod contact point 520 may contact a point on lower door surface 142 such that pod 100 is supported on tray 502 only at purge nozzles 510 and third pod contact point 520. Preferably, with the weight of pod 100 resting on flanges 372, there may still be a visually discernable vertical movement upon downward force applied to pod 100, in that there is preferably a tolerance of at least about 0.1 inch vertically in the resilient engagement of the purge nozzles 510 with the flange portion 372 when manual force is applied thereto.

Dry gas may then be introduced through tubing 512 and will flow through purge nozzles 510 and into purge diffuser assembly 350 through inlet openings 378. The dry gas will then be directed into the hermetically sealed space 118 through diffuser ports 366. In that diffuser ports 366 are oriented outwardly away from the reticle, the gas will not impinge on any patterned surface. A portion of the purge gas will egress through the filter 232 and out into the ambient atmosphere through the closed end 252.

Each of the purge diffuser assemblies 350 may be equipped with a check valve assembly 356 received in hollow interior space 376 of sealing insert 354, and configured to allow a unidirectional flow past and prevent ingress or egress of gaseous or particulate contaminants into the hermetically sealed space 118 when the system is not in use. Diaphragm valves with slits such as those described in U.S. Pat. No. 5,482,161 referenced above may also be employed in conjunction with or without the check valve assemblies 356. This is a mechanical means for limiting the exposure of the filter media 276, 278, 280, 282 and other media that the filter 232 may comprise of, to the ambient atmosphere external to the reticle carrier 100.

Of course, many alternative embodiments of the present SMIF reticle pod are possible and are within the scope of the invention, as will be appreciated by those of skill in the art. Moreover, the inventive aspects are applicable to other substrate containers such as FOUPS (front opening unified pods) for storing wafers. Such wafer containers are disclosed in U.S. Pat. Nos. 6,736,268 and RE 38,221, the disclosures of which are incorporated by reference herein. These substrate containers applicable to the invention have interior volumes ranging, preferably from about ⅓ of a liter to 10 liters and are generally principally comprised of rigid polymers such as polycarbonate. Although the description above contains many specificities, these should not be construed as limiting the scope of the invention but as merely providing illustrations of some of the presently preferred embodiments of the invention.

We claim:

1. A reticle SMIF pod for holding reticles used in the manufacture of semiconductors, the pod comprising:
    an upper shell with an open interior and an open bottom;
    a door configured to sealingly engage and latch to the upper shell at the open bottom, the door comprising a base, support members for a reticle extending from the base and defining a reticle pod receiving region, and a nozzle interface facing downwardly for interfacing with purging nozzles; the nozzle interface comprising a disk shaped cantilevered flange portion formed of a resilient polymer with a central opening for passing purge gas therethrough, the cantilevered flange portion positioned to be concentrically deflectable from the horizontal upwardly into a conical or rounded conical position when engaged with a purge nozzle.

2. The reticle SMIF pod of claim 1 wherein the purge port further comprises a diffuser, the diffuser having outlets extending upwardly and laterally outwardly away from the reticle receiving region.

3. The reticle SMIF pod of claim 1 wherein the nozzle interface is engaged within a purge port aperture in the door of the pod and nozzle interface further comprises a diffuser portion positioned in the open interior, the diffuser portion.

4. The reticle SMIF pod of claim 1 wherein the door has a purge port aperture and the nozzle interface portion comprises a grommet portion with an annular groove sized to sealing engage with purge port aperture and a central axial bore, and the cantilevered flange portion is integral with a tubular portion sized to be snugly received within central axial bore.

5. A combination purgible substrate container and purging station, the purging station having a substrate container receiving zone with an upwardly extending purge nozzle, the nozzle having a circular engagement lip with a diameter and positioned in a horizontal plane, the container comprising a nozzle interface with a cantilevered flange portion and a central aperture therein, the cantilevered flange portion extending horizontally and connecting with a supported portion radially inward from the cantilevered flange portion, the supported portion having a diameter less than that of the circular engagement lip, whereby when the substrate container is placed in the receiving zone with the nozzle interface aligned with the purge nozzle, the cantilevered flange portion flexes upwardly from the horizontal.

6. The combination of claim 5 wherein the nozzle is fixed with respect to the purging station and the engagement of the nozzle with the nozzle interface is provided by the weight of the substrate container resting partially on the nozzle.

7. The combination of claim 5 wherein the nozzle interface further comprises a grommet portion with diffuser ports extending into the substrate container.

8. The combination of claim 5 wherein the purging station comprises an enclosure and is configured as a reticle SMIF pod stocker and substrate container is configured as a reticle SMIF pod.

9. The combination of claim 5 wherein the substrate container is a front opening container and comprises wafer shelves.

10. A purgible substrate container for holding at least one substrate, the container comprising:
a container defining an open interior, the container including an open side and a purge port aperture;
supports attached to the container for holding the at least one substrate within the open container;
a door sealably latchable to said open side;
a purge nozzle interface assembly for injection of purge gas attached to the container at the purge port aperture, the purge assembly including a resilient polymer disk with a central aperture and a cantilevered peripheral portion, the disk supported radially inward from the cantilevered peripheral portion, the cantilevered portion having an unflexed position wherein the cantilevered peripheral portion extends horizontally and radially outward and a sealing engagement position wherein the cantilevered portion is flexed and extends upwardly at an angle from the horizontal unflexed position.

11. The purgible substrate container of claim 10 wherein the purge port interface assembly is on the door and further comprising a filter cartridge and a second purge nozzle interface assembly also positioned on the door.

12. A substrate container comprising containment wall with a purging aperture, a nozzle interface, the nozzle interface comprising a resilient polymeric sealing cantilevered flange portion positioned parallel to the containment wall and outwardly facing, a purge gas passageway extending axially through the sealing cantilevered flange portion into the interior of the substrate container, the cantilevered portion having an unflexed position wherein the cantilevered peripheral portion extends horizontally and radially outward and a sealing engagement position wherein the cantilevered portion is flexed and extends upwardly at an angle from the horizontal unflexed position.

13. A method of purging a substrate container, the substrate container having a purging port on a bottom side thereof, the purging port comprising a resilient polymeric thin annular portion, the annular portion having a downwardly facing engagement surface portion and an opposite upwardly facing side, the upwardly facing side not being supported, the method comprising the steps of:
placing the substrate container on purging station having an upwardly directed nozzle with the downwardly facing engagement surface,
bending the annular portion upwardly by the weight of the substrate container resting on the nozzle.

14. A substrate container with a purge port aperture and a purge port assembly attached therein, said purge port assembly comprising a body portion and a nozzle receiving portion both formed of a resilient polymer, said body portion having an annular channel shaped recess extending therearound and sized to sealingly fit the purge port aperture, said body portion further having a diffuser port and a bore extending axially through the body and in communication with the diffuser port, the nozzle receiving portion comprising a flange portion integral with a tubular portion, the flange portion having a central aperture and comprising a supported flange portion and a cantilevered flange portion concentric with and extending radially away from the supported flange portion, and a tubular portion integral with the supported flange portion, the tubular portion sized to be insertably retained within the bore of the body portion, whereby the flange portion is positioned exteriorly of the container, the diffuser port is interiorly positioned and there is an axial purge path through the purge port assembly.

15. A method of confirming placement of a substrate container on a purge station on a purge nozzles, comprising applying downward pressure and visually observing and feeling a deflection of at least about 0.1 inch to confirm the proper engagement, the deflection arising from an upward deflection of a cantilevered peripheral portion of a cantilevered flange portion.

16. A reticle pod stocker in combination with a plurality of reticle pods, the stocker comprising:
a vertical post having purge gas tubing therein and connectible to a purge gas source,
a plurality of trays swivelably connected to the vertical post, whereby each of the trays swing horizontally to a plurality of different positions, each tray configured for receiving reticle pods and having a purge nozzle extending upwardly therefrom, each purge nozzle connecting to the purge gas tubing. The plurality of reticle pods each having a downwardly directed cantilevered purge interface flange, the flange having a supported portion and a cantilevered portion, the reticle pods positioned on trays of the pod stocker with the cantilevered portions engaged with the upwardly extending nozzles whereby the cantilevered portions are flexed upwardly from a horizontal position.

17. The reticle pod stocker of claim 16, further characterized by an enclosure that contains said post and said plurality of trays.

18. The reticle pod stocker of claim 16, wherein each tray has a receiving zone for a reticle SMIF pod and a aperture in said tray centrally below said region for allowing discharge of purge gas from the bottom side of such reticle SMIF pods.

* * * * *